US012572083B2

(12) United States Patent
Kreuzer et al.

(10) Patent No.: US 12,572,083 B2
(45) Date of Patent: Mar. 10, 2026

(54) INTENSITY ORDER DIFFERENCE BASED METROLOGY SYSTEM, LITHOGRAPHIC APPARATUS, AND METHODS THEREOF

(71) Applicants: ASML Holding N.V., Veldhoven (NL); ASML Netherlands B.V., Veldhoven (NL)

(72) Inventors: Justin Lloyd Kreuzer, Trumbull, CT (US); Simon Reinald Huisman, Eindhoven (NL); Sebastianus Adrianus Goorden, Eindhoven (NL); Filippo Alpeggiani, Eindhoven (NL)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 121 days.

(21) Appl. No.: 18/255,543

(22) PCT Filed: Dec. 2, 2021

(86) PCT No.: PCT/EP2021/084056
§ 371 (c)(1),
(2) Date: Jun. 1, 2023

(87) PCT Pub. No.: WO2022/122565
PCT Pub. Date: Jun. 16, 2022

(65) Prior Publication Data
US 2024/0094641 A1 Mar. 21, 2024

Related U.S. Application Data

(60) Provisional application No. 63/216,355, filed on Jun. 29, 2021, provisional application No. 63/123,548, filed on Dec. 10, 2020.

(51) Int. Cl.
*G03F 7/00* (2006.01)

(52) U.S. Cl.
CPC .... *G03F 7/70633* (2013.01); *G03F 7/706837* (2023.05); *G03F 7/706849* (2023.05)

(58) Field of Classification Search
CPC ............ G03F 7/70483; G03F 7/70633; G03F 7/706837; G03F 7/706849; G06F 16/958;
(Continued)

(56) References Cited

U.S. PATENT DOCUMENTS 6,297,876 B1 10/2001 Bornebroek
6,961,116 B2 11/2005 Den Boef et al.
(Continued)

FOREIGN PATENT DOCUMENTS

TW 2012-29496 A 7/2012
TW 2014-28262 A 7/2014
(Continued)

OTHER PUBLICATIONS

International Search Report and Written Opinion of the International Searching Authority directed to International Patent Application No. PCT/EP2021/084056, mailed Apr. 8, 2022; 16 pages.
(Continued)

*Primary Examiner* — Deoram Persaud
(74) *Attorney, Agent, or Firm* — Pillsbury Winthrop Shaw Pittman, LLP

(57) ABSTRACT

The system includes a radiation source, a diffractive element, an optical system, a detector, and a processor. The radiation source generates radiation. The diffractive element diffracts the radiation to generate a first beam and a second beam. The first beam includes a first non-zero diffraction order and the second beam includes a second non-zero diffraction order that is different from the first non-zero diffraction order. The optical system receives a first scattered beam and a second scattered radiation beam from a target structure and directs the first scattered beam and the second (Continued)

scattered beam towards a detector. The detector generates a detection signal. The processor analyzes the detection signal to determine a target structure property based on at least the detection signal. The first beam is attenuated with respect to the second beam or the first scattered beam is purposely attenuated with respect to the second scattered beam.

11 Claims, 11 Drawing Sheets

(58) Field of Classification Search
CPC ...... G06F 16/972; G06F 21/60; G06F 21/602; G06F 21/62; G06F 21/6245
See application file for complete search history.

(56) References Cited

U.S. PATENT DOCUMENTS

| | | | |
|---|---|---|---|
| 7,511,799 B2 | 3/2009 | Tel et al. | |
| 8,706,442 B2 | 4/2014 | Mos et al. | |
| 9,784,987 B2 | 10/2017 | Hill et al. | |
| 9,946,167 B2 | 4/2018 | Smilde et al. | |
| 10,133,188 B2 | 11/2018 | Jak et al. | |
| 10,152,654 B2 | 12/2018 | Pandev | |
| 10,732,516 B2 | 8/2020 | Pandev et al. | |
| 11,360,399 B2 | 6/2022 | Goorden et al. | |
| 11,971,665 B2* | 4/2024 | Adams | G03F 9/7065 |
| 12,025,925 B2* | 7/2024 | Alpeggiani | G03F 9/7046 |
| 2005/0094153 A1 | 5/2005 | Nikoonahad et al. | |
| 2012/0123581 A1 | 5/2012 | Smilde et al. | |
| 2014/0146322 A1 | 5/2014 | Hill et al. | |
| 2015/0204664 A1* | 7/2015 | Bringoltz | G02B 27/4255 |
| | | | 356/508 |
| 2016/0011523 A1* | 1/2016 | Singh | G01N 21/4788 |
| | | | 355/77 |
| 2018/0224753 A1 | 8/2018 | Mathijssen et al. | |
| 2019/0204759 A1* | 7/2019 | Shome | G03F 9/7073 |

| | | | |
|---|---|---|---|
| 2020/0209608 A1 | 7/2020 | Beukman et al. | |
| 2021/0132509 A1* | 5/2021 | Huisman | G03F 7/70641 |
| 2022/0197151 A1* | 6/2022 | Mehta | G03F 7/70591 |
| 2023/0213871 A1* | 7/2023 | Goorden | G03F 9/7049 |
| | | | 355/67 |
| 2023/0273531 A1* | 8/2023 | Swillam | G03F 9/7092 |
| | | | 355/67 |
| 2023/0324817 A1* | 10/2023 | Ebert | G03F 7/706851 |
| | | | 355/67 |
| 2023/0400782 A1* | 12/2023 | Cappelli | G03F 7/70633 |
| 2024/0036485 A1* | 2/2024 | Beukman | G03F 7/70625 |
| 2024/0077308 A1* | 3/2024 | Swillam | G03F 7/70633 |
| 2024/0160110 A1* | 5/2024 | Winters | G03F 7/70508 |
| 2024/0263941 A1* | 8/2024 | Cheng | G01B 11/272 |
| 2025/0028258 A1* | 1/2025 | Voznyi | G03F 9/7084 |

FOREIGN PATENT DOCUMENTS

| | | |
|---|---|---|
| TW | 202014672 A | 4/2020 |
| TW | 2020-18430 A | 5/2020 |
| TW | 2020-28874 A | 8/2020 |
| WO | WO 2020/057900 A1 | 3/2020 |

OTHER PUBLICATIONS

International Preliminary Report on Patentability directed to International Patent Application No. PCT/EP2021/084056, issued Jun. 13, 2023; 13 pages.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

Raymond et al., "Multiparameter grating metrology using optical scatterometry," Proc. SPIE, vol. 2725, Metrology, Inspection, and Process Control for Microlithography X, May 21, 1996; pp. 361-368.

"Lithographic Apparatus, Metrology Systems, and Methods Thereof," Research Disclosure No. 676036, Jul. 7, 2020; 51 pages.

\* cited by examiner

600

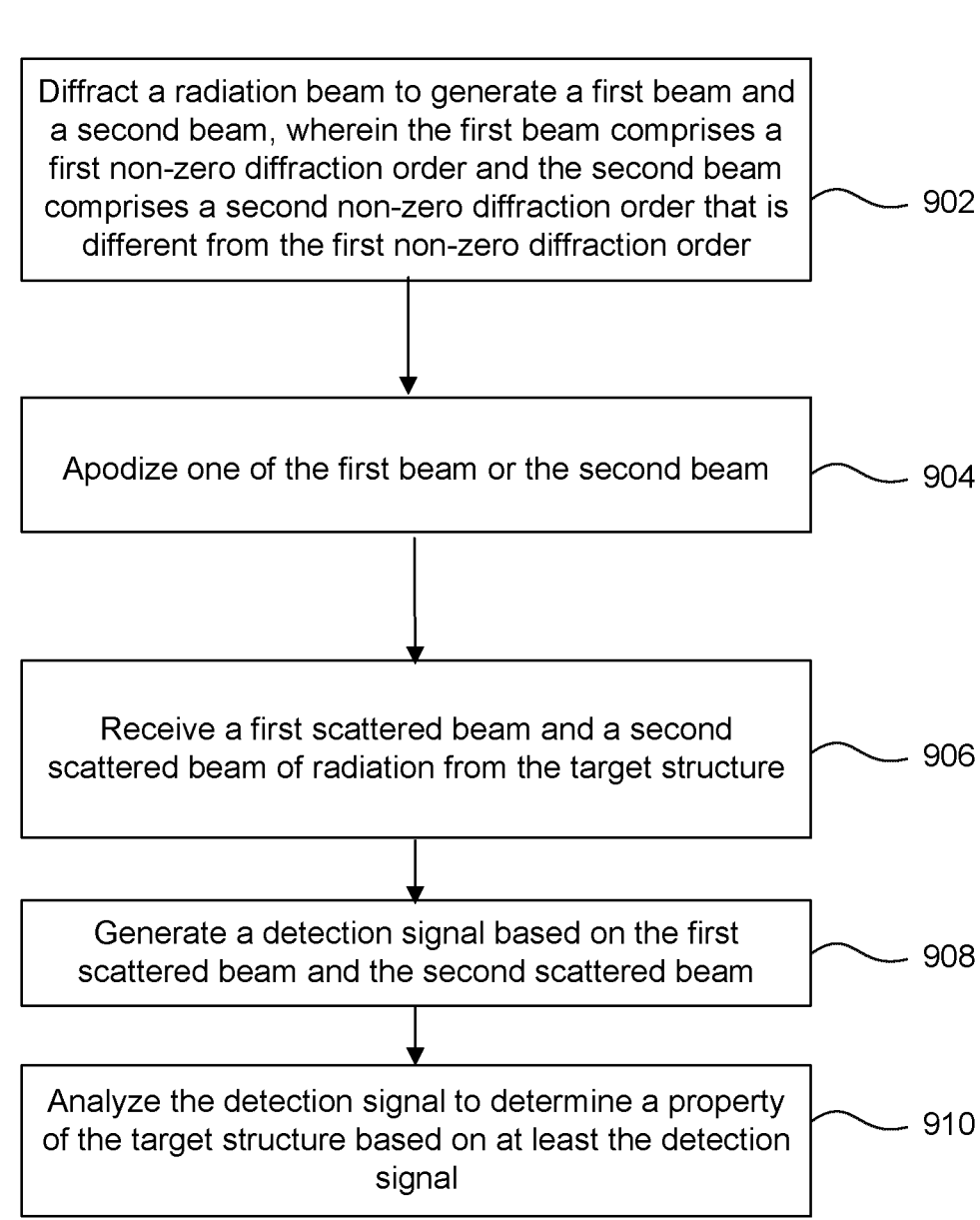

900

Diffract a radiation beam to generate a first beam and a second beam, wherein the first beam comprises a first non-zero diffraction order and the second beam comprises a second non-zero diffraction order that is different from the first non-zero diffraction order — 902

Apodize one of the first beam or the second beam — 904

Receive a first scattered beam and a second scattered beam of radiation from the target structure — 906

Generate a detection signal based on the first scattered beam and the second scattered beam — 908

Analyze the detection signal to determine a property of the target structure based on at least the detection signal — 910

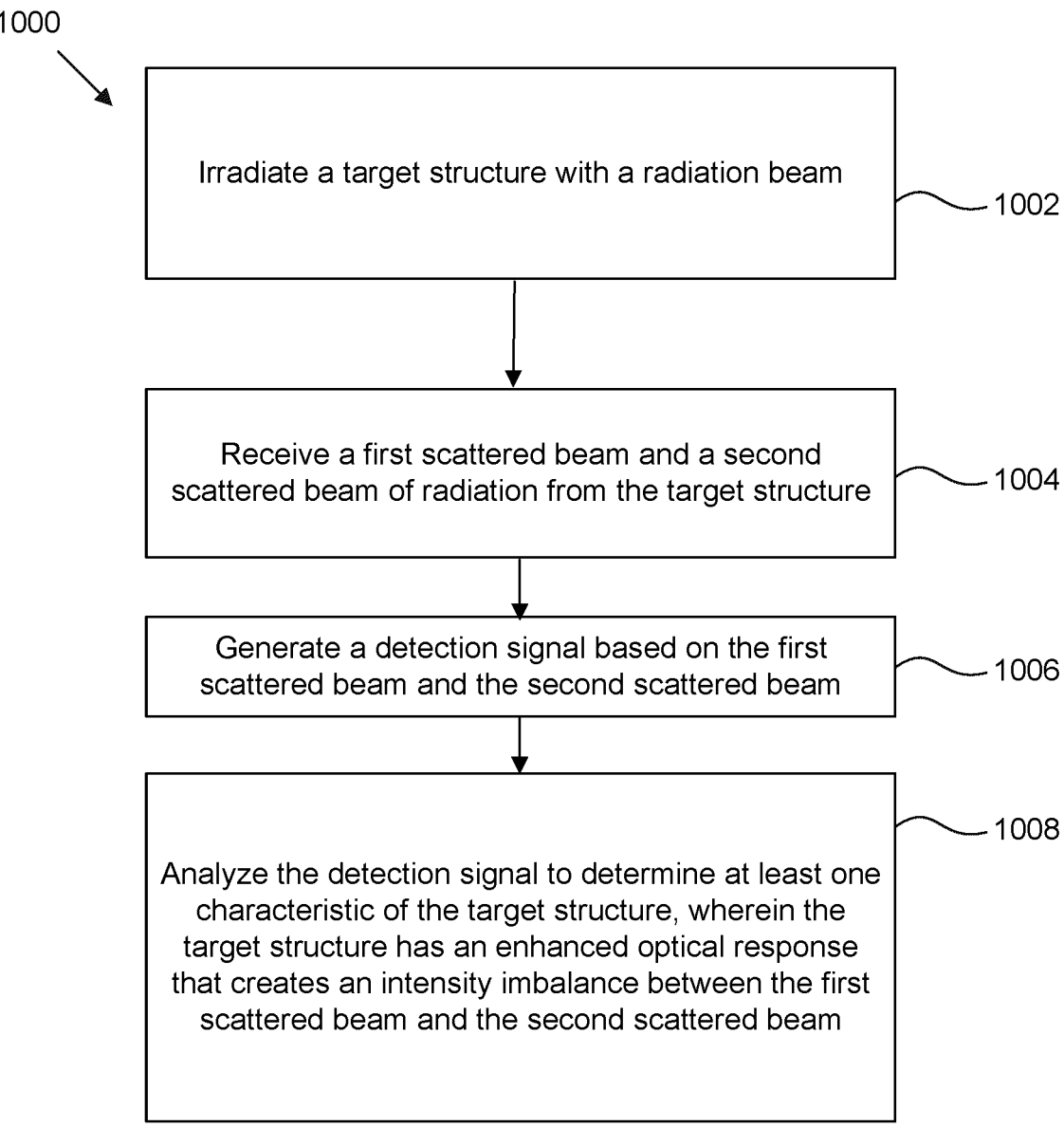

Irradiate a target structure with a radiation beam — 1002

Receive a first scattered beam and a second scattered beam of radiation from the target structure — 1004

Generate a detection signal based on the first scattered beam and the second scattered beam — 1006

Analyze the detection signal to determine at least one characteristic of the target structure, wherein the target structure has an enhanced optical response that creates an intensity imbalance between the first scattered beam and the second scattered beam — 1008

FIG. 10

INTENSITY ORDER DIFFERENCE BASED METROLOGY SYSTEM, LITHOGRAPHIC APPARATUS, AND METHODS THEREOF

CROSS-REFERENCE TO RELATED APPLICATIONS

This application claims priority of (1) U.S. Provisional Patent Application No. 63/123,548, which was filed on Dec. 10, 2020, and (2) U.S. Provisional Patent Application No. 63/216,355, which was filed on Jun. 29, 2021, both of which are incorporated herein in their entirety by reference.

FIELD

The present disclosure relates to lithographic systems, for example, systems and methods for overlay measurements.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a group of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During a lithographic operation, different processing steps typically require different layers to be sequentially formed on the substrate. Accordingly, it may be necessary to position the substrate relative to prior patterns formed thereon with a high degree of accuracy. Positions of alignment marks placed on a substrate may be detected using an alignment apparatus. Misalignment between alignment marks as two different layers is measured as overlay error.

Errors in alignment of wafers in a lithographic apparatus result in reduced quality unreliable performance, and reduced yield rates of fabricated devices, which in turn increases time and cost of fabrication of devices.

SUMMARY

There is a need to provide improved techniques for overlay measurements.

In some embodiments, a system includes a radiation source, a diffractive element, an optical element, an optical system, a detector, and a processor. The radiation source generates radiation. The diffractive element diffracts the radiation to generate a first beam and a second beam. The first beam includes a first non-zero diffraction order and the second beam includes a second non-zero diffraction order that is different from the first non-zero diffraction order. The optical element attenuates one of the first beam or the second beam. The optical system receives a first scattered beam and a second scattered beam of radiation from the target structure and directs the first scattered beam and the second scattered beam towards a detector. The detector generates a detection signal. The processor analyzes the detection signal to determine a property of the target structure based on at least the detection signal.

In some embodiments, a method includes diffracting a radiation beam to generate a first beam and a second beam, apodizing one of the first beam or the second beam, irradiating a target structure with the first beam and the second beam, receiving a first scattered beam and a second scattered beam of radiation from the target structure, generating, by an imaging detector, a detection signal based on the first scattered beam and the second scattered beam, and analyzing the detection signal to determine a property of the target structure based on an intensity imbalance between the first scattered beam and the second scattered beam. The first beam includes a first non-zero diffraction order and the second beam includes a second non-zero diffraction order that is different from the first non-zero diffraction order.

In some embodiments, a method comprises irradiating a target structure with a radiation beam, receiving a first scattered beam and a second scattered beam of radiation from the target structure, generating a detection signal using an imaging detector based on the first scattered beam and the second scattered beam, and analyzing the detection signal to determine at least one characteristic of the target structure. The target structure has an enhanced optical response that creates an intensity imbalance between the first scattered beam and the second scattered beam.

In some embodiments, a system includes a radiation source, an optical element, an optical system, a detector, and a processor. The radiation source is configured to generate radiation. The optical element is configured to generate a first beam and a second beam. The first beam comprises a first non-zero diffraction order and the second beam comprises a second non-zero diffraction order that is different from the first non-zero diffraction order. The first beam is attenuated with respect to the second beam. The optical system is configured to direct the first beam and the second beam towards a target structure, receive a first scattered beam and a second scattered beam of radiation from the target structure, and direct the first scattered beam and the second scattered beam towards a detector. The detector is configured to generate a detection signal. The processor is configured to analyze the detection signal to determine a property of the target structure based on at least the detection signal.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

FIG. 9 shows a process for performing functions related to determining an intensity difference, according to some embodiments.

FIG. 10 shows a process for performing functions related to determining an intensity difference, according to some embodiments.

Figure 1A:
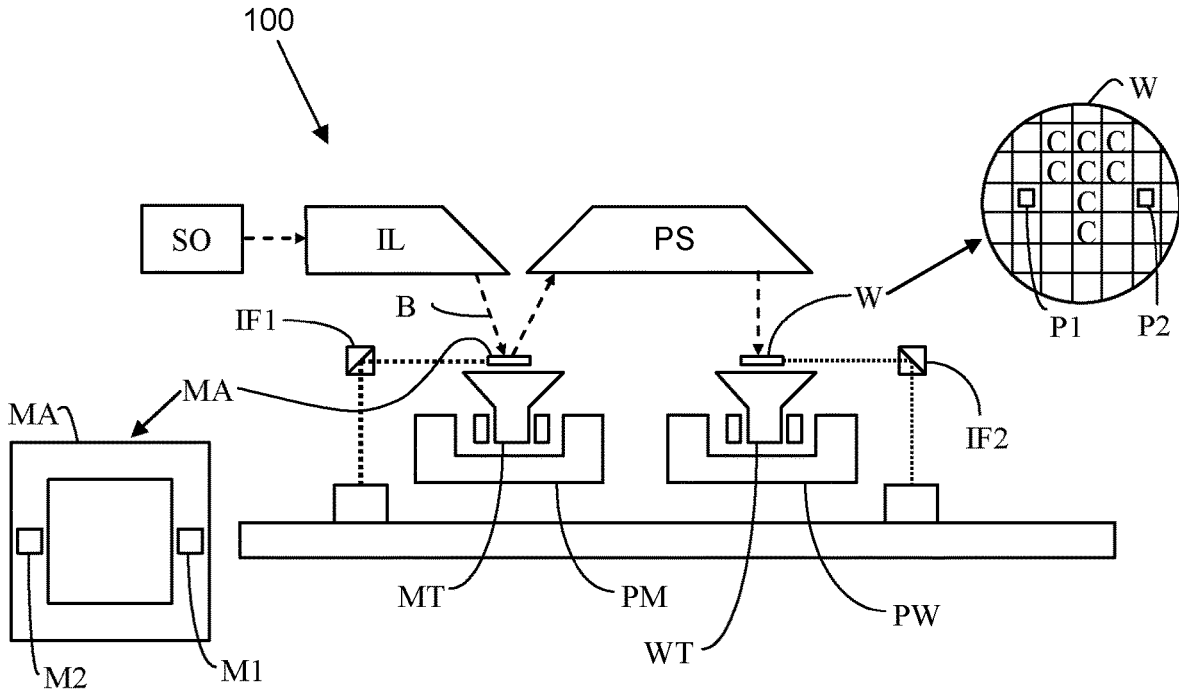
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc. The term "non-transitory" may be used herein to characterize computer readable media used for storing data, information, instructions, and the like, with the sole exception being a transitory, propagating signal.

Before describing such embodiments in more detail, however, it is instructive to present an example environment in which embodiments of the present disclosure can be implemented.

Example Lithographic Systems

Figure 1B:
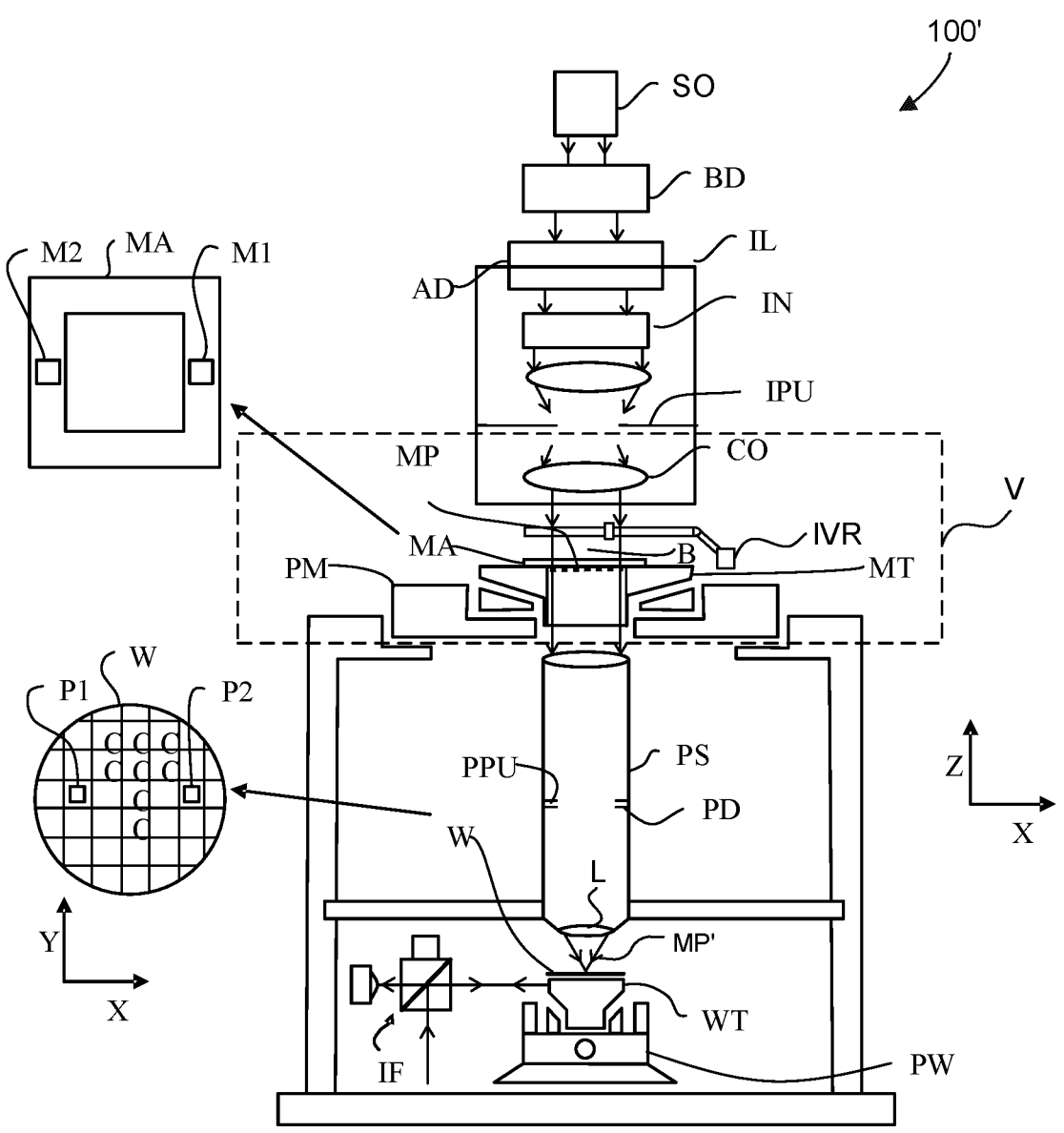
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate (PPU) to an illumination system pupil (IPU). Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In some embodiments, a lithographic apparatus may generate DUV and/or EUV radiation. For example, lithographic apparatus 100' may be configured to operate using a DUV source. In another example, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figures 2, 3:
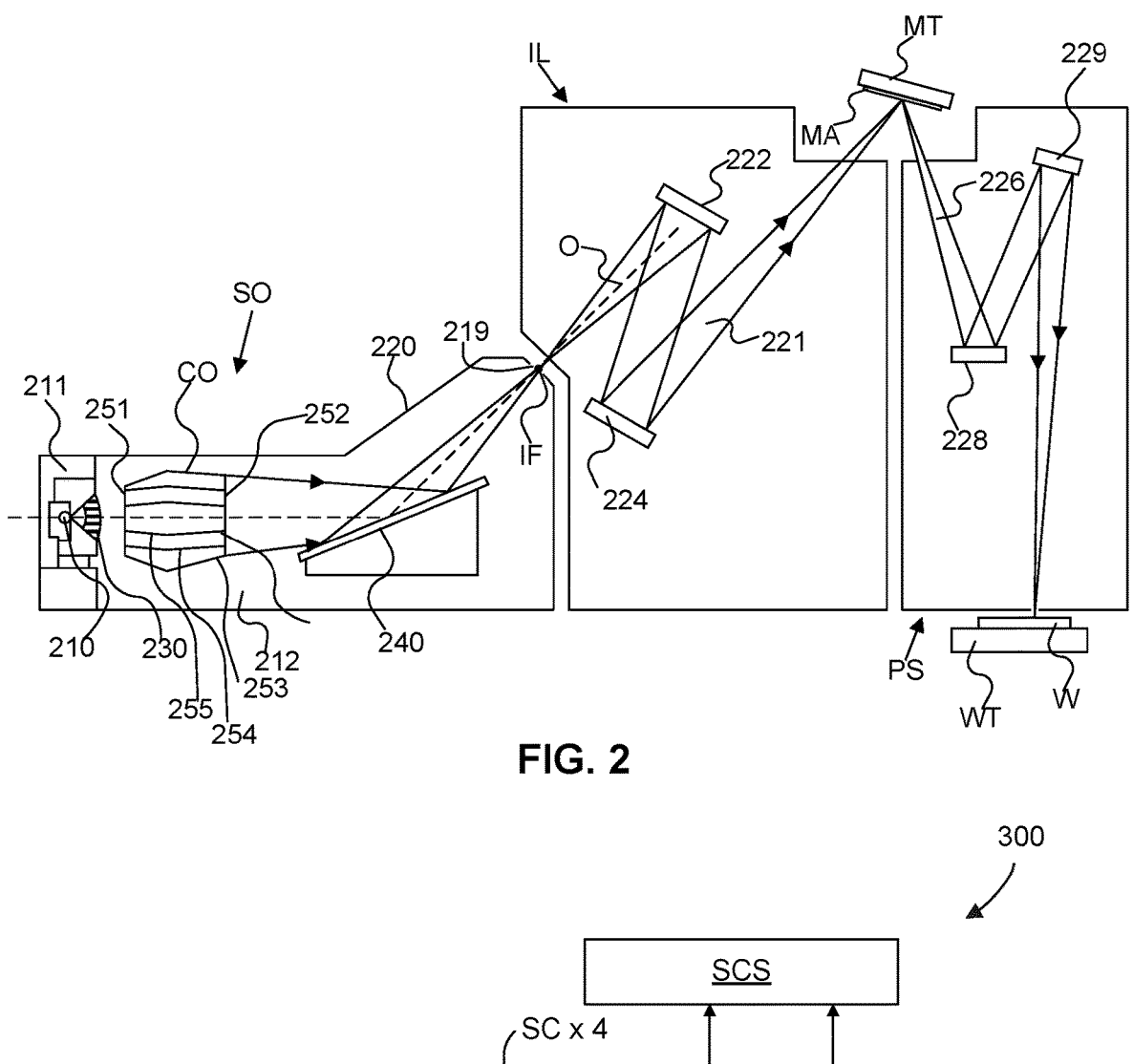
FIG. 2 shows a more detailed schematic of the reflective lithographic apparatus, according to some embodiments.
FIG. 3 shows a schematic of a lithographic cell, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 can be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 can optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

FIG. 3 shows a lithographic cell 300, also sometimes referred to a lithocell or cluster, according to some embodiments. Lithographic apparatus 100 or 100' may form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Metrology Apparatus

Figure 4A:
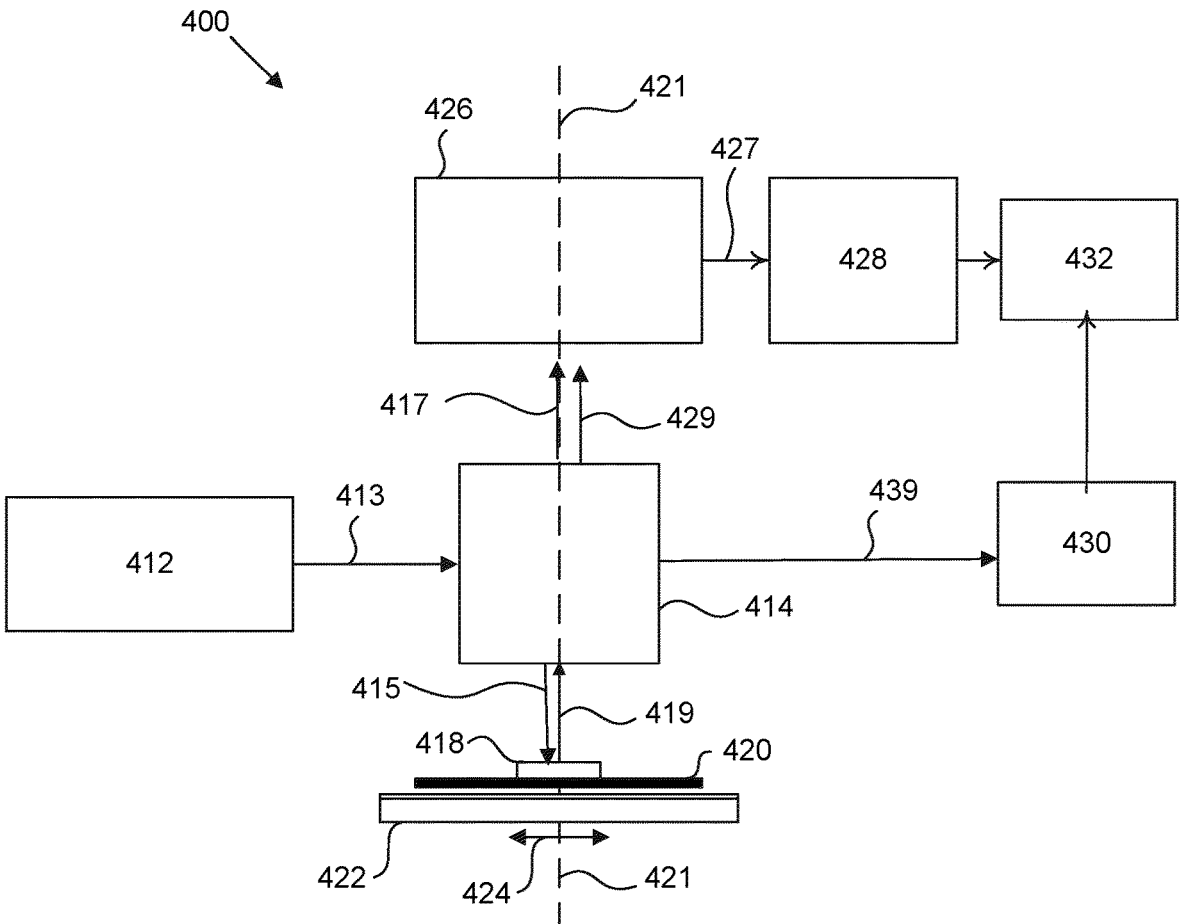
FIGS. 4A-4B show a schematic of a metrology system, according to some embodiments.

FIG. 4A shows a schematic of a cross-sectional view of an inspection apparatus 400 that can be implemented as a part of lithographic apparatus 100 or 100', according to some embodiments. In some embodiments, inspection apparatus 400 can be configured to align a substrate (e.g., substrate W) with respect to a patterning device (e.g., patterning device MA). Inspection apparatus 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

In some embodiments, inspection apparatus 400 can include an illumination system 412, a beam splitter 414, an interferometer 426, a detector 428, a beam analyzer 430, and an overlay calculation processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., inspection apparatus 400) compared to the current alignment apparatuses.

In some embodiments, beam splitter 414 can be configured to receive radiation beam 413 and split radiation beam 413 into at least two radiation sub-beams. For example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some embodiments, alignment mark or target 418 can have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some embodiments, beam splitter 414 can be further configured to receive diffraction radiation beam 419 and split diffraction radiation beam 419 into at least two radiation sub-beams, according to an embodiment. Diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 180° and recombine the rotated and unrotated images interferometrically.

In some embodiments, detector 428 can be configured to receive the recombined image via interferometer signal 427 and detect interference as a result of the recombined image when alignment axis 421 of inspection apparatus 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can be obtained, for example, with any type of alignment sensor, for example a SMASH (SMart Alignment Sensor Hybrid) sensor, as described in U.S. Pat. No. 6,961, 116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of inspection apparatus 400 or any other reference element such that the center of symmetry of alignment mark or target 418 can be known with reference to inspection apparatus 400 or any other reference element. Beam analyzer 430 can be a point or an imaging polarimeter with some form of wavelength-band selectivity. In some embodiments, beam analyzer 430 can be directly integrated into inspection apparatus 400, or connected via fiber optics of several types: polarization preserving single mode, multimode, or imaging, according to other embodiments.

In some embodiments, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some embodiments, the measured overlay data can also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some embodiments, beam analyzer 430 can be further configured to determine a model of the product stack profile of substrate 420, and can be configured to measure overlay, critical dimension, and focus of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
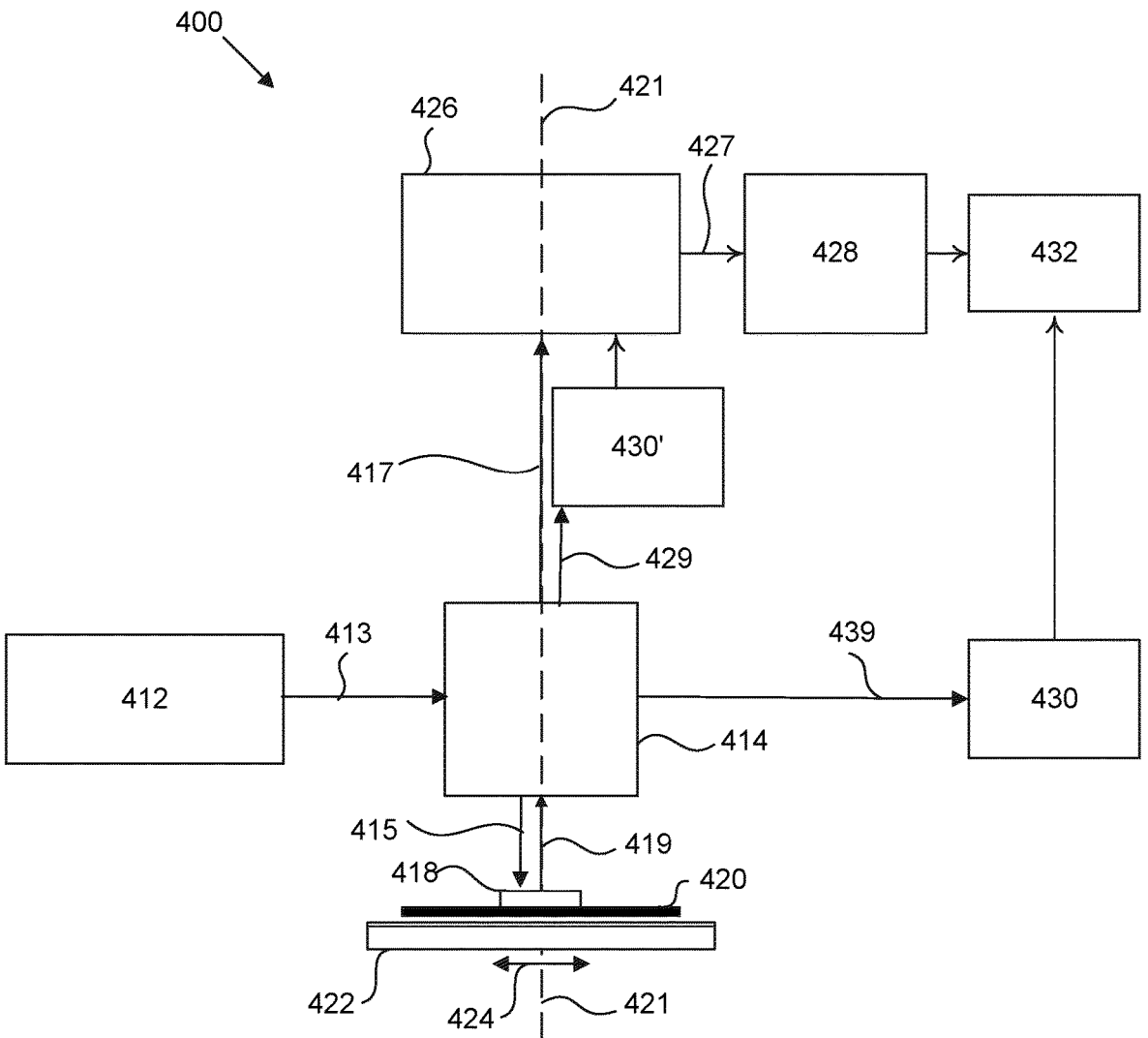

In some embodiments, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of inspection apparatus 400, or any other reference element, such that the center of symmetry of alignment mark or target 418 can be known with reference to inspection apparatus 400, or any other reference element. Second beam analyzer 430' can be further configured to determine the overlay data between two patterns and a model of the product stack profile of substrate 420. Second beam analyzer 430' can also be configured to measure overlay, critical dimension, and focus of target 418 in a single measurement.

In some embodiments, second beam analyzer 430' can be directly integrated into inspection apparatus 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In some embodiments, processor 432 receives information from detector 428 and beam analyzer 430. For example, processor 432 can be an overlay calculation processor. The information can comprise a model of the product stack profile constructed by beam analyzer 430. Alternatively, processor 432 can construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 can create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 can utilize the basic correction algorithm to characterize the inspection apparatus 400 with reference to wafer marks and/or alignment marks 418.

In some embodiments, processor 432 can be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 can utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However, this is in relation to a target with a programmed overlay of −30 nm. Consequently, the process must have introduced an overlay error of 29 nm.

TABLE 1

| | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, can be determined and selected. Following this, processor 432 can group marks into sets of similar overlay error. The criteria for grouping marks can be adjusted based on different process controls, for example, different error tolerances for different processes.

In some embodiments, processor 432 can confirm that all or most members of the group have similar offset errors, and apply an individual offset correction from the clustering algorithm to each mark, based on its additional optical stack metrology. Processor 432 can determine corrections for each mark and feed the corrections back to lithographic apparatus 100 or 100' for correcting errors in the overlay, for example, by feeding corrections into the inspection apparatus 400.

Intensity Imbalance Determination

Asymmetric marks (e.g., mark shown in FIG. 6) can cause imbalance between positive and negative intensity diffraction orders that can decrease the accuracy of overlay and alignment measurements. Intensity difference between positive and negative mark-diffracted orders may be used to improve overlay accuracy and robustness especially for process induced alignment mark asymmetry. In some aspects, an intensity imbalance between conjugate diffracted orders may be used for asymmetry correction applications. Exemplary applications are described in WO Publication number 2020057900 which is incorporated by reference herein in its entirety.

In some embodiments, an optical filter may be used to create a transmission imbalance between the diffracted orders. In some aspects, one of the diffracted orders can be apodised by a transmission factor α (or order transmission), with respect to the conjugate order (e.g., diffraction order +1 with respect to diffraction order −1, otherwise referred to as opposite portions of the diffraction spectrum). The transmission imbalance between the diffracted orders is used to determine the intensity imbalance caused by mark-asymmetry from an alignment interferogram. In some aspects, the intensity imbalance can be determined from a fringe visibility of the interferogram. In some embodiments, the optical filter can be at a pupil plane of the metrology system or in the illumination branch of the metrology system as described further below.

Figure 5:
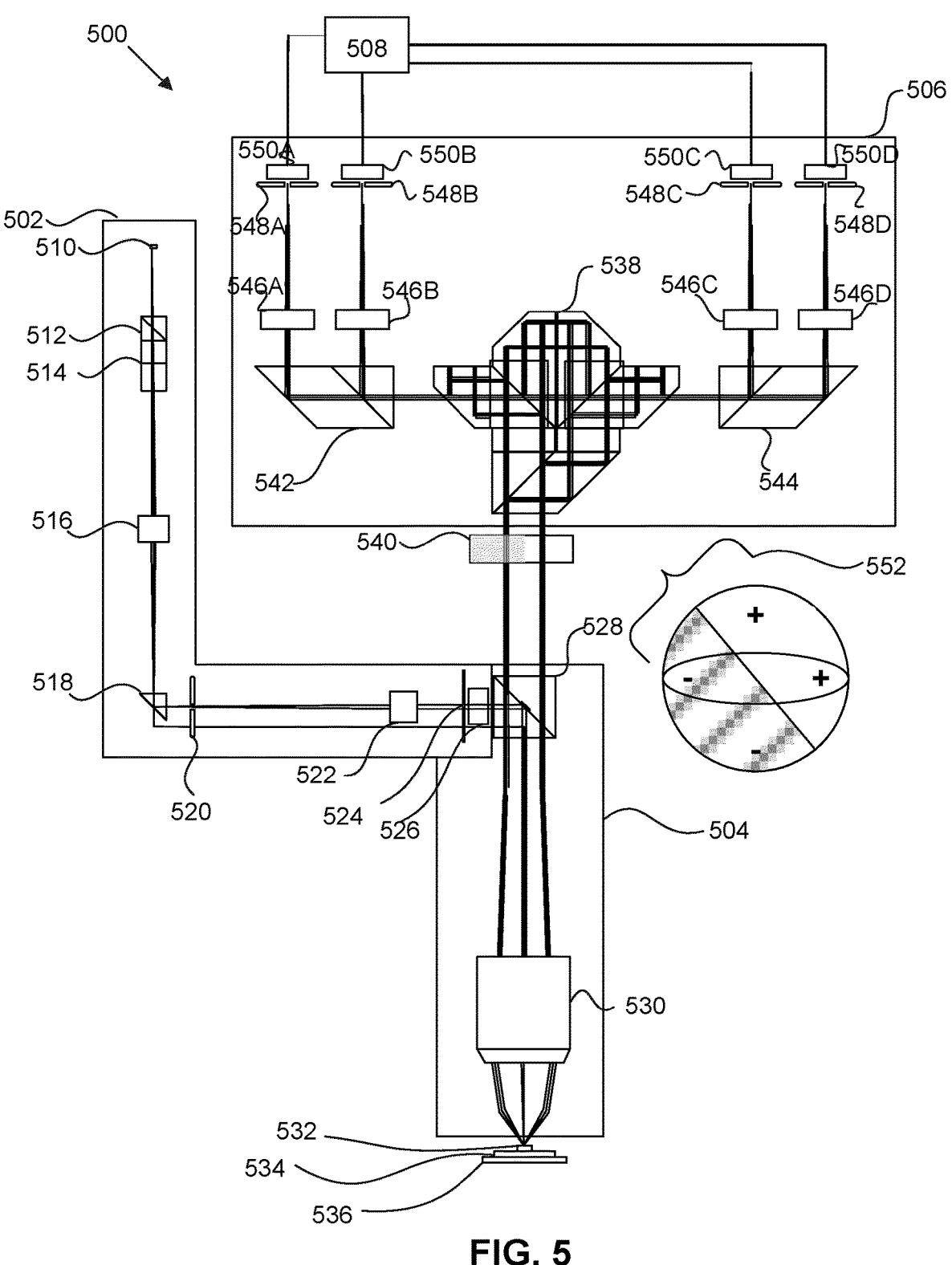
FIG. 5 shows a schematic of a metrology system, according to some embodiments.

An implementation to measure the intensity difference is illustrated in FIG. 5, which deploys an optical filter, in front one of the diffracted order in order to attenuate one while allowing the other to pass through without modification.

FIG. 5 shows a schematic of a metrology system 500, according to some embodiments. In some embodiments, metrology system 500 can also represent a more detailed view of inspection apparatus 400 (FIGS. 4A and 4B). For example, FIG. 5 illustrates a more detailed view of illumination system 412 and its functions.

In some embodiments, metrology system 500 includes an illumination system 502, an optical system 504, a detector system 506, and a processor 508. Illumination system 502 can comprise a radiation source 510, a polarizer 512, a retarder 514 (e.g., a waveplate), a first optical element(s) 516 (e.g., a lens or lens system), a reflective element 518 (e.g., a total internal reflection prism), a field stop 520, a second optical element(s) 522, a waveplate 524, and an aperture stop 526. Optical system 504 can comprise a reflective element 528 (e.g., spot mirror) and an optical element 530 (e.g., an objective lens). The reflective element 528 can act as a field stop for zero order diffracted radiation.

FIG. 5 shows a non-limiting depiction of metrology system 500 inspecting a target 532 (also "target structure") on a substrate 534. The substrate 534 is disposed on a stage 536 that is adjustable (e.g., a support structure that can move). It should be appreciated the structures drawn within illumination system 502 and optical system 504 are not limited to their depicted positions. The positions of structures can vary as necessary, for example, as designed for a modular assembly.

Figure 6:
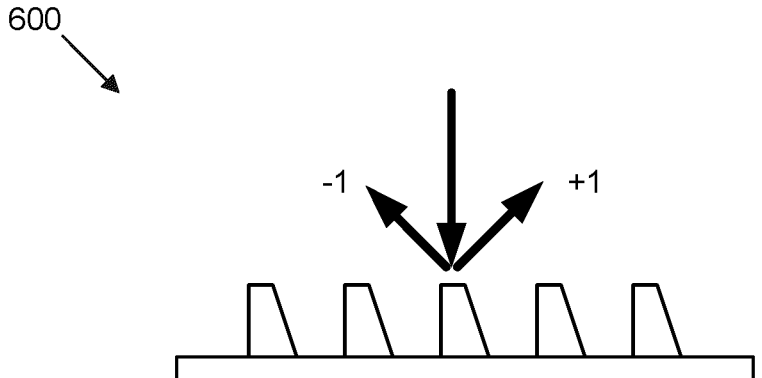
FIG. 6 shows a schematic of asymmetric marks, according to some embodiments.

In some embodiments, target 532 can comprise a diffractive structure (e.g., a grating(s) as shown in FIG. 6). Target 532 can reflect, refract, diffract, scatter, or the like, radiation. For ease of discussion, and without limitation, radiation that interacts with a target will be termed scattered radiation throughout. The scattered radiation is collected by optical element 530.

In some embodiments, system 500 includes an optical filter 540 that is used to obtain additional information on asymmetry. Optical filter 540 can be an attenuating filter (e.g., a neutral density filter). Optical filter 540 can be an amplitude and/or phase apodizing filter. Optical filter 540 can be placed over the negative or positive diffraction orders. Optical filter 540 creates a bias between the positive and negative diffraction orders. Optical filter 540 can be positioned in a pupil plane of the detection system 506. In other embodiments, the optical filter 540 can be positioned near the pupil or in the illumination path.

In some embodiments, optical filter 540 can be exchangeable. For example, optical filters having different intensity transmission coefficient may be used and the optical filter that provides the best performance (i.e., intensity difference accuracy) may be selected.

In some embodiments, optical filter 540 can be rotatable. For example, an orientation of the filter may be based on the target structure. The orientation may be 45 or 0 degree for symmetrical fine wafer alignment (SF) or bidirectional fine wafer alignment (BF) marks, respectively. Other angles may also be useful. For example, an angle of 22 degrees may be used for mixed marks. Further, optical filter 540 can be removed when desired depending on the current process wafers.

Insert 552 shows the positioning of the filter with respect to the optical signal. Insert 552 shows a partial filter for negative SF mark orders.

The detection system 506 can include a self-referencing interferometer 538 and one or more detectors. The scattered radiation is then passed by the optical filter 540 and to the self-referencing interferometer 538.

A further beam splitter 542 splits the optical signal into two paths A and B. One path contains the sum of the two rotated fields, and the other contains the difference. Similarly, a beam splitter 544 splits the optical signal into two paths C and D, each path representing the sum and the difference of the rotated fields. The radiation of each path A, B, C, and D is collected by a respective lens assembly 546A, 546B, 546C, and 546D. It then goes through an aperture 548A, 548B, 548C, or 548D, that eliminates most of the radiation from outside the spot on the substrate. Lens assembly 546A, 546B, 546C, and 546D focus the radiation field into each detector 550A, 550B, 550C, and 550D respectively. Each detector provide a time-varying signals (waveforms) synchronized with the physical scanning movement between the system 500 and the target 532. Signals from the detectors are processed by processor 508.

FIG. 6 is a schematic that shows an asymmetric mark 600 according to one example. In some embodiments, processing steps may lead to asymmetric marks (e.g., deformed alignment marks such as top tilt, floor tilt, side wall angle). Asymmetric marks may produce an asymmetric imbalance between the positive and negative diffraction orders that is a function of wavelength and polarization.

In some embodiments, the apodization may be applied on the illumination side of the metrology system.

Figure 7:
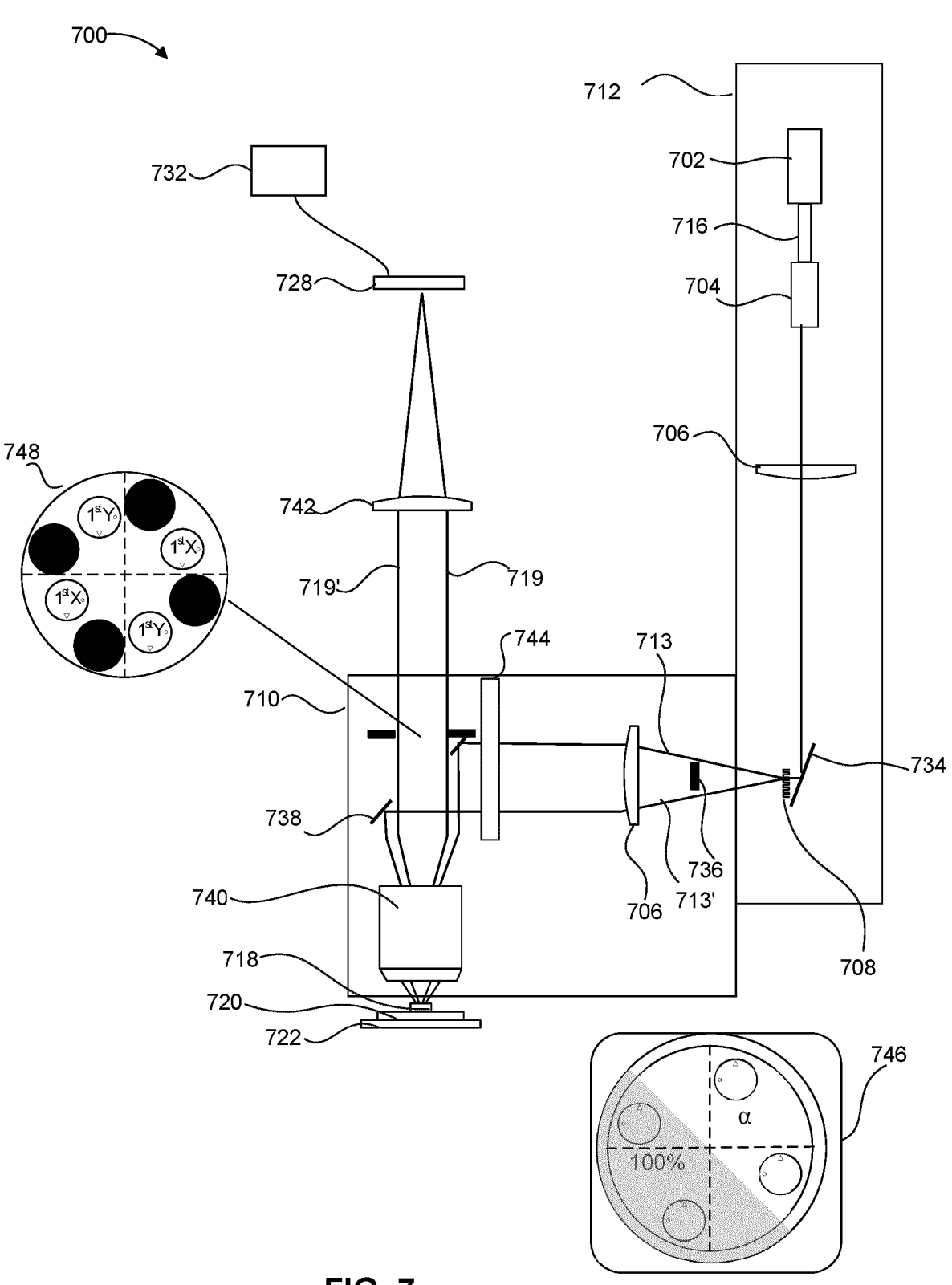
FIG. 7 shows a schematic of a metrology system, according to some embodiments.

FIG. 7 shows a metrology system 700, according to some embodiments. In some embodiments, metrology system 700 can also represent a more detailed view of inspection apparatus 400 (FIGS. 4A and 4B). For example, FIG. 7 illustrates a more detailed view of illumination system 412 and its functions. Unless otherwise noted, elements of FIG. 7 that have similar reference numbers (e.g., reference numbers sharing the two right-most numeric digits) as elements of FIGS. 4A and 4B can have similar structures and functions.

In some embodiments, metrology system 700 comprises an illumination system 712, an optical system 710, a detector 728, and a processor 732. Illumination system 712 can comprise a radiation source 702, an optical fiber 704 (e.g., a multi-mode fiber), an optical element(s) 706 (e.g., a lens or lens system), a reflective element 734, and a diffractive element 708 (e.g., a grating, adjustable grating, and the like). Optical system 710 can comprise one or more of optical elements 706, a blocking element 736, a reflective element 738 (e.g., spot mirror), and an optical element 740 (e.g., an objective lens). FIG. 7 shows a non-limiting depiction of metrology system 700 inspecting a target 718 (also "target structure") on a substrate 720. The substrate 720 is disposed on a stage 722 that is adjustable (e.g., a support structure that can move). It should be appreciated the structures drawn within illumination system 712 and optical system 710 are not limited to their depicted positions. For example, diffractive element 708 can be within optical system 710. The positions of structures can vary as necessary, for example, as designed for a modular assembly.

In some embodiments, radiation source 702 can generate radiation 716. Radiation 716 can be spatially incoherent. Since the output of radiation source 702 cannot be pointed directly toward downstream optical structures, optical fiber 704 can guide radiation 716 to downstream optical structures. Optical element(s) 706 can direct or condition radiation 716 (e.g., focus, collimate, make parallel, and the like). Diffractive element 708 can diffract radiation 716 to generate beams of radiation 713 and 713' (also first and second beams of radiation). Beam of radiation 713 can comprise a first non-zero diffraction order from diffractive element 708 (e.g., +1 order). Beam of radiation 713' can comprise a second non-zero diffraction order from diffractive element 708 (e.g., −1 order) that is different from the first non-zero diffraction order. Diffractive element 708 can also generate a zeroth order beam (not labeled). Blocking element 736 can block the zeroth order beam to allow darkfield measurements. Reflective element 738 can direct beams of radiation 713 and 713' toward target 718. Optical element 740 focuses beams of radiation 713 and 713' onto target 718 such that illumination spots of both beams overlap. The illumination spots can underfill or overfill target 718.

In some embodiments, target 718 can comprise a diffractive structure (e.g., a grating(s) as shown in FIG. 6). Target 718 can reflect, refract, diffract, scatter, or the like, radiation. For ease of discussion, and without limitation, radiation that interacts with a target will be termed scattered radiation throughout. Target 718 can scatter incident radiation, which is represented by scattered beams of radiation 719 and 719' (also first and second scattered beams of radiation). Scattered beam of radiation 719 can represent radiation from beam of radiation 713 that has been scattered by target 718. Similarly, scattered beam of radiation 719' can represent radiation from beam of radiation 713' that has been scattered by target 718. Optical element 742 focuses scattered beams of radiation 719 and 719' such that scattered beams of radiation 719 and 719' interfere at detector 728. Optical element 740 directs beams of radiation 713 and 713' such that they are incident on target 718 at non-zero incidence angles (e.g., off-axis). The term "off-axis" and "wide-angle" may be used herein to refer to a propagation direction that is oblique with respect to a surface, particularly with respect to a plane of a target. The image at the detector 728 can be an interference pattern. Detector 728 can generate a detection signal based on having received scattered beams of radiation 719 and 719'. Detector 728 can be an imaging detector (e.g., CCD, CMOS, or the like). In this scenario, the detection signal can comprise a digital or analog representation of an image comprising the interference pattern, which are sent to processor 732. In some aspects, the image may correspond to a region-of-interest.

In some embodiments, the metrology system 700 can include an optical filter 744. The optical filter 744 can be similar to the optical filter 540 of FIG. 5. In some aspects, the optical filter 744 can be positioned between blocking element 736 and reflective element 738. Insert 746 shows a partial filter having an apodizing factor α. Insert 748 shows the detection pupil.

In some embodiments, processor 732 can analyze the detection signal to determine a property of target 718. It should be appreciated that the measurement process can be different depending on the specific property of target 718 being determined. For example, in the case where the property of target 718 being determined is an alignment position, a measurement is performed on target 718 alone. In another example, in the case where the property of target 718 being determined is an overlay error, the measurement compares target 718 to a second target. Overlay error determination is a process that compares a first target (on a first layer of fabrication) to a second target (on a second layer of fabrication that is different from the first layer) and determines whether the first and second layers are properly overlayed on top of each other. The first and second targets can be, for example, stacked on top of each other or fabricated side-by-side. Determination of other properties of target 718, from either target 718 alone or in conjunction with another target, can be envisaged (e.g., line width, pitch, critical dimension, and the like). Moreover, while beams of radiation 713 and 713' are described above as both being incident on target 718 (i.e., alignment measurement), embodiments can be envisaged where a beam of radiation is directed to another target to allow, for example, overlay error measurements. For example, beams of radiation 713 and/or 713' can be replicated (e.g., using a beam splitter) for sending to another target. For example, the target 718 may include four targets (e.g., gratings) positioned closely together so that they will all be within a measurement spot formed by the optical system 710. The targets may be simultaneously illuminated and imaged on detector 728. The four targets may be composite grating formed by overlying gratings that are patterned in different layers on a device formed on substrate 720. In some aspects, the targets may have different orientations with respect to each other so as to diffract incoming radiation in X and Y directions.

In some embodiments, analysis performed by processor 732 can be based on target 718 having been irradiated by beams of radiation 713 and 713' (e.g., alignment measurement), which have different diffraction orders (e.g., +1 and −1). The analysis comprises, for example, calculating an intensity difference between the different diffraction order (e.g., +1 and −1) as described previously herein. In some aspects, mixed orders may be used. For example, a first image may be obtained using diffraction orders (+1 and −2) and a second image with diffraction orders (−1 and +2). In another example, a first image may use diffraction orders (+1 and +2) and the second image with diffraction orders (−1 and −2).

In some embodiments, an intensity imbalance can be measured at a pixel level based on the image captured at detector 728. In some aspects, metrology system 700 can provide within-mark fringe visibility. The intensity imbalance is determined from the within-mark fringe visibility. Thus, the asymmetry (e.g., an asymmetric mark 600) per pixel is detected from the fringe visibility. In some aspects, within-mark variations may be corrected for based on the determined intensity imbalance. As described further below, the amplitude and DC component are extracted locally and the fringe visibility is calculated from the AC and DC.

In some embodiments, apodization may be created using a transmission plates, a spatial light modulator (SLM), or a strongly asymmetric off-axis beam grating. For example, diffractive element 708 can comprise an asymmetric off-axis beam grating. In some aspects, the asymmetric off-axis beam grating can generate beams of radiation 713 and/or 713' such that one of the beams of radiation 713 or 713' is apodised with respect to the other beam. In such case, optical filter 744 can be omitted.

In some embodiments, optical filter 744 can have a different apodization factor in the x and y direction. In some aspects, the optical filter can have a spatially patterned apodization.

In some embodiments, an intensity difference between a positive and a negative order diffraction signals is determined. Information from the intensity difference may be used to compensate for alignment mark asymmetry. In some embodiments, information from the intensity difference may be used to compensate for overlay mark asymmetry. For example, the overlay mark may comprise one or more structures on multiple layers. In some aspects, an image captured by detector 728 may show the structures positioned close to each other.

In some embodiments, a correlation between the fringe visibility and an intensity imbalance may be determined.

The intensity imbalance Q may be expressed as:

$$Q = \frac{I_+ - I_-}{I_+ + I_-} \qquad (8)$$

The I+ may be expressed as a function of the intensity imbalance as:

$$I_+ = I_- \frac{(1 + Q)}{(1 - Q)} \qquad (10)$$

The fringe visibility f may be expressed as $$f = \frac{AC}{DC} = \frac{2\sqrt{I_1 I_2}}{I_1 + I_2} \qquad (11)$$

If the positive order is apodised, then $$I_1 = \alpha I_+ = \alpha I_- \frac{(1 + Q)}{(1 - Q)}$$

and $I_2 = I_-$ and the fringe visibility f can be expressed as (for small Q):

$$f = \frac{2\sqrt{\frac{1 + Q}{1 - Q}}}{\sqrt{\alpha}\frac{1 + Q}{1 - Q} + \frac{1}{\sqrt{\alpha}}} \approx \frac{2}{\sqrt{\alpha} + \frac{1}{\sqrt{\alpha}}} + 2\frac{\frac{1}{\sqrt{\alpha}} - \sqrt{\alpha}}{\left(\sqrt{\alpha} + \frac{1}{\sqrt{\alpha}}\right)^2}Q \qquad (12)$$

In some embodiments, a fringe visibility of an ideal grating in the presence of the optical filter is calculated. The calibrated intensity imbalance may be expressed as:

$$Q' = \frac{\partial Q}{\partial f} = (f - f_{ref}) \qquad (13)$$

In some embodiments, the apodization factor $\alpha$ that may result in the greatest sensitivity of the fringe visibility is selected for the optical filter. For example, the sensitivity of the fringe visibility to normalized intensity changes Q as a function of the apodization factor is determined. In some aspects, $$\frac{\partial Q}{\partial f} = 2$$

for an apodization factor equals to 0.17.

In some embodiments, the metrology system (e.g., metrology system 500 and metrology system 700) may be calibrated. For example, the hardware is calibrated for each system state (e.g., grating period, wavelength, polarization, scan direction, mark type). In some aspects, calibration on a target is performed to determine f ref to account for loss of coherence due to spot clippings and polarization mismatches. In some embodiments, calibration may be needed because of DC signal bias. For example, the DC signal may also be biased by unwanted stray light from blocked zero orders (e.g., by blocking element 736).

In some embodiments, DC and AC components can be premeasured (e.g., isolate from detection signal) before final calibration. The intensity ratio is determined for each mark.

In some embodiments, two similar high marks with significantly different degrees of asymmetry are used in the calibration are used. Signals with the wafer rotated at 0 and 180 degrees are measured.

In some embodiments, amplitude modulation may be used at an appropriate frequency (i.e., >scan signal frequency) to minimize the DC drift.

In some embodiments, processor 508 can analyze the detection signal to determine a property of target 532. For example, processor 508 can determine an intensity difference based on equation (7). In some aspects, processor 508 can determine an intensity imbalance based on equation (12).

In some embodiments, radiation source 510 can include one or more sources to provide radiation with different wavelengths of radiation.

In some embodiments, one or more demultiplexers may split each path into multiple signals corresponding to the different wavelengths of radiation.

While the examples described herein concentrate on the +/−1" order diffraction signals, it will be understood that the disclosure extends to the capture and analysis of higher orders (e.g., +/−$2^{nd}$ order, +/−$3^{rd}$ order, etc.).

In some embodiments, intentional asymmetry in the mark 600 (e.g., alignment mark or overlay mark) is introduced. For example, an enhanced optical response is created by controlling sub-segmentation in mark 600. In some aspects, the mark may introduce an intensity asymmetry between diffracted orders. Thus, the intensity asymmetry can be interpreted as an intentional transmission bias between the diffracted orders (e.g., scattered beams of radiation 719 and 719'). In some aspects, the apodization factor can be based on the asymmetry of the mark. For example, the apodization factor can be dependent on the sub-segmentation type, stack, and/or illumination profile (e.g., polarization, wavelength). Thus, the transfer function between the interferogram and the intensity imbalance may be dependent on the illumination profile and stack profile.

In some embodiments, the intensity imbalance can be determined from the fringe visibility of the interferogram. In some aspects, the intensity imbalance for a nominal symmetric mark (i.e., no process asymmetry) may not be zero due to the sub-segmentation. The sub-segmentation may cause the intensity imbalance to be about 0.3.

Figure 8:
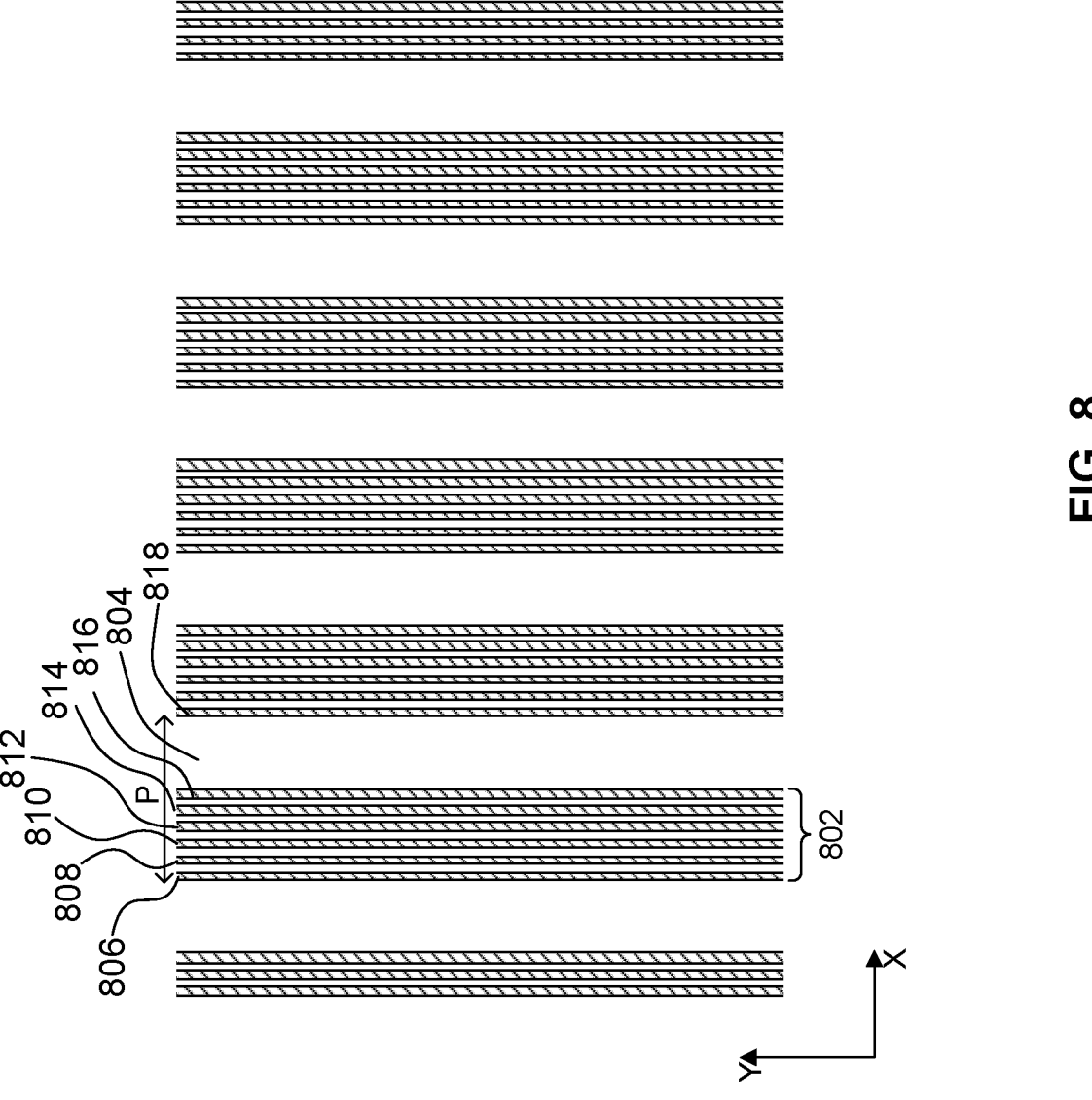
FIG. 8 shows a schematic of an alignment mark, according to some embodiments.

FIG. 8 illustrates a mark 800 according to one example. Mark 800 may have periodic patterns including lines 802, spaces 804, and a pitch P, as shown in FIG. 8.

In some aspects, each of lines 802 has a plurality of sub-segments 806 through 816. The mark may include different numbers of sub-segments. For example, FIG. 8 shows six sub-segments, however as would be understood by one of ordinary skill in the art, lines 802 may include less or more than 6 sub-segments. The term "pitch" as used herein refers to a distance from a given point on one of the line to the same point on an adjacent line, as shown (e.g., from sub-segment 806 to sub-segment 818).

In some aspects, each sub-segment has a different width. For example, a width of each of the sub-segments 806 through 816 has a width different from one another. The width of sub-segment 806 can be smaller than the width of sub-segment 816. In one example, the width of the sub-segment increases in a first direction "X". The above discussed spaces in the patterns of the mark may be void. The mark may be formed on the stack (device) and/or on the resist.

In some embodiments, the mark 800 described herein has an enhanced optical response that causes intensity imbalance due to the artificial asymmetry introduced by controlling the sub-segmentation and/or creating deformed marks. The artificial asymmetry can be made much stronger than the unwanted mark asymmetry, providing the desired intensity imbalance between diffracted orders.

In one example, the mark 800 is etched under an angle to create deformed marks. Other types of sub-segmented marks may also be used. In some aspects, marks may have a periodic rectangular pattern with different duty cycles. In some aspects, mark may have sub-segmentations having different width. In some embodiments, a combination of two or more marks of different types may be used. In some aspects, the two or more marks may be selected such as first mark has a strong response at a first wavelength and second mark has a strong response at a second wavelength such as to optimize the sensitivity of fringe visibility at the first wavelength and the second wavelength.

In some embodiments, the approaches described herein may be implemented in an integrated optical system (e.g., alignment sensor, overlay sensor). For example, the optical filter may be disposed on a photonic integrated circuit that includes the illumination system and detection system.

FIG. 9 shows method steps for performing functions described herein, according to some embodiments. The method steps of FIG. 9 can be performed in any conceivable order and it is not required that all steps be performed. Moreover, the method steps of FIG. 9 described below merely reflect an example of steps and are not limiting. That is, further method steps and functions may be envisaged based upon embodiments described in reference to FIGS. 1-8.

At step 902, a radiation beam is diffracted to generate a first beam and a second beam. The first beam comprises a first non-zero diffraction order and the second beam comprises a second non-zero diffraction order that is different from the first non-zero diffraction order.

At step 904, one of the first beam or the second beam is apodized.

At step 906, a target structure is irradiated with the first beam and the second beam.

At step 908, a first scattered beam and a second scattered beam of radiation is received from the target structure at an imaging detector.

At step 910, the imaging detector may generate a detection signal based on the first scattered beam and the second scattered beam.

At step 912, the detection signal is analyzed to determine a property of the target structure based on an intensity imbalance between the first scattered beam and the second scattered beam.

FIG. 10 shows method steps for performing functions described herein, according to some embodiments. The method steps of FIG. 10 can be performed in any conceivable order and it is not required that all steps be performed. Moreover, the method steps of FIG. 10 described below merely reflect an example of steps and are not limiting. That is, further method steps and functions may be envisaged based upon embodiments described in reference to FIGS. 1-8.

At step 1002, a target structure is irradiated with a radiation beam.

At step 1004, a first scattered beam and a second scattered beam of radiation are received from the target structure at an imaging detector.

At step 1006, a detection signal is generated using an imaging detector based on the first scattered beam and the second scattered beam.

At step 1008, the detection signal is analyzed to determine at least one characteristic of the target structure. The target structure has an enhanced optical response that creates an intensity imbalance between the first scattered beam and the second scattered beam.

The embodiments may further be described using the following clauses:

1. A system comprising:
   a radiation source configured to generate radiation;

a diffractive element configured to diffract the radiation to generate a first beam and a second beam, wherein the first beam comprises a first non-zero diffraction order and the second beam comprises a second non-zero diffraction order that is different from the first non-zero diffraction order; an optical system configured to:

direct the first beam and the second beam towards a target structure, receive a first scattered beam and a second scattered beam of radiation from the target structure, and direct the first scattered beam and the second scattered beam towards a detector;

the detector configured to generate a detection signal;

a processor configured to analyze the detection signal to determine a property of the target structure based on at least the detection signal; and an optical element configured to attenuate the first beam with respect to the second beam or the first scattered beam with respect to the second scattered beam.

2. The system of clause 1, wherein the optical element is positioned between the radiation source and the optical system and configured to attenuate the first beam with respect to the second beam.

3. The system of clause 1, wherein the optical element positioned in an optical path of the first scattered beam between the target structure and the detector and configured to attenuate the first scattered beam with respect to the second scattered beam.

4. The system of clause 1, wherein the analyzing comprises determining an intensity imbalance between the first scattered beam and the second scattered beam.

5. The system of clause 4, wherein the intensity imbalance is based on an AC component and a DC component of the detection signal.

6. The system of clause 5, wherein the analyzing comprises determining a fringe visibility based on the AC component and the DC component of the detection signal.

7. The system of clause 1, wherein the property of the target structure comprises an metrology mark symmetry.

8. The system of clause 1, wherein the first beam is associated with a positive diffraction order and the second beam is associated with a negative diffraction order.

9. A method comprising:

diffracting a radiation beam to generate a first beam and a second beam, wherein the first beam comprises a first non-zero diffraction order and the second beam comprises a second non-zero diffraction order that is different from the first non-zero diffraction order;

apodizing one of the first beam or the second beam;

irradiating a target structure with the first beam and the second beam;

receiving a first scattered beam and a second scattered beam of radiation from the target structure;

generating, by an imaging detector, a detection signal based on the first scattered beam and the second scattered beam; and analyzing the detection signal to determine a property of the target structure based on an intensity imbalance between the first scattered beam and the second scattered beam.

10. The method of clause 9, wherein the analyzing comprises determining the intensity imbalance based on a within the mark fringe visibility.

11. The method of clause 10, further comprising determining the within the mark fringe visibility based on determining an AC component and a DC component of the detection signal at a pixel level of the imaging detector.

12. The method of clause 9, wherein the apodizing comprises: passing one of the first beam or the second beam through an optical filter.

13. The method of clause 12, wherein the passing comprises passing one of the first scattered beam or the second scattered beam through an amplitude and/or phase apodizing filter.

14. The method of clause 9, further comprising filtering the detection signal to isolate an AC component and a DC component.

15. The method of clause 9, further comprising: generating the radiation beam from an incoherent radiation source.

16. A method comprising:

irradiating a target structure with a radiation beam;

receiving a first scattered beam and a second scattered beam of radiation from the target structure;

generating a detection signal using an imaging detector based on the first scattered beam and the second scattered beam; and analyzing the detection signal to determine at least one characteristic of the target structure, wherein the target structure has an enhanced optical response that creates an intensity imbalance between the first scattered beam and the second scattered beam.

17. The method of clause 16, wherein the enhanced optical response is achieved by providing a sub-segmented metrology mark, the target structure comprising the sub-segmented metrology mark.

18. The method of clause 16, wherein the analyzing further comprises determining an intensity imbalance based on an AC component and a DC component of the detection signal.

19. The method of clause 18, further comprising:

identifying a model between the intensity imbalance and the AC component and a DC component of the detection signal based on at least an illumination profile of the radiation beam.

20. A system comprising:

a radiation source configured to generate radiation;

a diffractive element configured to diffract the radiation to generate a first beam and a second beam, wherein the first beam comprises a first non-zero diffraction order and the second beam comprises a second non-zero diffraction order that is different from the first non-zero diffraction order;

an optical system configured to:

direct the first beam and the second beam towards a target structure, receive a first scattered beam and a second scattered beam of radiation from the target structure, and direct the first scattered beam and the second scattered beam towards a detector;

the detector configured to generate a detection signal; and a processor configured to analyze the detection signal to determine a property of the target structure based on at least the detection signal, wherein the target structure has an enhanced optical response that creates an intensity imbalance between the first scattered beam and the second scattered beam.

In some embodiments, metrology systems (alignment sensor and/or overlay sensor) described herein may be implemented in a larger system, for example, within a lithographic apparatus.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The invention claimed is:

1. A system comprising:
a radiation source configured to generate incoherent radiation;
a diffractive element configured to diffract the incoherent radiation to generate a first beam and a second beam, wherein the first beam comprises a first non-zero diffraction order and the second beam comprises a second non-zero diffraction order that is different from the first non-zero diffraction order;
an optical system configured to:
    direct the first beam and the second beam towards a target structure,
    receive a first scattered beam and a second scattered beam of radiation from the target structure,
    direct the first scattered beam and the second scattered beam towards a detector, and
    apodize one of the first beam or the second beam using an optical filter;
the detector configured to generate a detection signal;
a processor configured to:
    analyze the detection signal to determine a fringe intensity between the first scattered beam and the second scattered beam based on an AC component and a DC component of the detection signal to determine an intensity imbalance, and
    use the intensity imbalance to determine asymmetry of the target structure,
wherein the optical system comprises an optical element configured to attenuate the first beam with respect to the second beam or the first scattered beam with respect to the second scattered beam.

2. The system of claim 1, wherein the optical element is positioned between the radiation source and the optical system and configured to attenuate the first beam with respect to the second beam.

3. The system of claim 1, wherein the optical element positioned in an optical path of the first scattered beam between the target structure and the detector and configured to attenuate the first scattered beam with respect to the second scattered beam.

4. The system of claim 1, wherein the property of the target structure comprises a metrology mark symmetry.

5. The system of claim 1, wherein the first beam is associated with a positive diffraction order and the second beam is associated with a negative diffraction order.

6. The system of claim 1, wherein the target structure has an enhanced optical response that creates the intensity imbalance between the first scattered beam and the second scattered beam.

7. A method comprising:

diffracting an incoherent radiation beam to generate a first beam and a second beam, wherein the first beam comprises a first non-zero diffraction order and the second beam comprises a second non-zero diffraction order that is different from the first non-zero diffraction order;

apodizing or attenuating one of the first beam or the second beam using an optical filter;

irradiating a target structure with the first beam and the second beam;

receiving a first scattered beam and a second scattered beam of radiation from the target structure;

generating, by a detector, a detection signal based on the first scattered beam and the second scattered beam;

analyzing, by a processor, the detection signal to determine a fringe intensity between the first scattered beam and the second scattered beam based on an AC component and a DC component of the detection signal to determine an intensity imbalance; and using the intensity imbalance to determine asymmetry of the target structure.

8. The method of claim 7, further comprising passing one of the first scattered beam or the second scattered beam through an amplitude and/or phase apodizing filter.

9. A method comprising:

irradiating a target structure with first and second inco-herent radiation beams;

apodizing or attenuating one of the first beam or the second beam;

receiving a first scattered beam and a second scattered beam of radiation from the target structure;

generating a detection signal using an imaging detector based on the first scattered beam and the second scattered beam;

analyzing the detection signal to determine a fringe inten-sity between the first scattered beam and the second scattered beam based on an AC component and a DC component of the detection signal to determine an intensity imbalance; and using the intensity imbalance to determine asymmetry of the target structure.

10. The method of claim 9, wherein the target structure has an enhanced optical response that creates the intensity imbalance between the first scattered beam and the second scattered beam and wherein the enhanced optical response is achieved by providing a sub-segmented metrology mark, the target structure comprising the sub-segmented metrology mark.

11. The method of claim 9, further comprising:

identifying a model between the intensity imbalance and the AC component and a DC component of the detec-tion signal based on at least an illumination profile of the radiation beam.

* * * * *